(12) United States Patent
Casu et al.

(10) Patent No.: US 12,104,900 B2
(45) Date of Patent: Oct. 1, 2024

(54) SENSOR WITH ESTIMATED REAL-TIME PARAMETER DATA

(71) Applicant: Allegro MicroSystems, LLC, Manchester, NH (US)

(72) Inventors: Emanuele Andrea Casu, Annecy (FR); Nicolás Rigoni, Manchester, NH (US); Ross Eisenbeis, Litchfield, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 105 days.

(21) Appl. No.: 17/936,469

(22) Filed: Sep. 29, 2022

(65) Prior Publication Data

US 2024/0110777 A1 Apr. 4, 2024

(51) Int. Cl.
*G01B 7/30* (2006.01)
*G01P 3/44* (2006.01)

(52) U.S. Cl.
CPC . *G01B 7/30* (2013.01); *G01P 3/44* (2013.01)

(58) Field of Classification Search
None
See application file for complete search history.

(56) References Cited

U.S. PATENT DOCUMENTS

| | | | |
|---|---|---|---|
| 4,551,676 A | 11/1985 | Amemiya et al. | |
| 4,746,862 A | 5/1988 | Ueki | |
| 6,542,847 B1 | 4/2003 | Lohberg et al. | |
| 6,687,644 B1 | 2/2004 | Zinke et al. | |
| 6,815,944 B2 | 11/2004 | Vig et al. | |
| 7,026,808 B2 | 4/2006 | Vig et al. | |
| 7,091,876 B2 | 8/2006 | Steger | |
| 7,747,146 B2 | 6/2010 | Milano et al. | |
| 8,122,159 B2 | 2/2012 | Monreal | |
| 8,183,982 B2 | 5/2012 | Scherr | |
| 8,453,518 B2 | 6/2013 | Diekmann et al. | |
| 8,461,782 B2 | 6/2013 | Ward et al. | |
| 8,519,819 B2 | 8/2013 | Scherr | |

(Continued)

FOREIGN PATENT DOCUMENTS

| | | |
|---|---|---|
| DE | 196 34 714 A1 | 3/1998 |
| DE | 196 50 935 A1 | 6/1998 |

(Continued)

OTHER PUBLICATIONS

PCT Invitation to Pay Additional Fees and Partial Search Report dated Jun. 20, 2023 for International Application No. PCT/US2023/064519; 9 Pages.

(Continued)

*Primary Examiner* — Jas A Sanghera
(74) *Attorney, Agent, or Firm* — DALY, CROWLEY, MOFFORD & DURKEE, LLP

(57) ABSTRACT

Methods and apparatus receiving data at a first time from at least one sensor, determining a parameter from the received data for the first time, estimating the parameter for a future time based on the data for first time, and outputting the estimated parameter for the future time to a receiving device. In some embodiments, an IC package can process the received data to generate the estimated parameter for the future time. The IC package may transmit the estimated parameter using a particular protocol. In some embodiments, the receiving device can treat the estimated parameter as real-time data.

30 Claims, 5 Drawing Sheets

(56) References Cited

U.S. PATENT DOCUMENTS

| | | | |
|---|---|---|---|
| 8,577,634 B2 | 11/2013 | Donovan et al. | |
| 8,729,890 B2 | 5/2014 | Donovan et al. | |
| 8,860,404 B2 | 10/2014 | Dwyer et al. | |
| 8,922,331 B2 | 12/2014 | Scherr | |
| 8,948,280 B2 | 2/2015 | Hammerschmidt et al. | |
| 9,007,054 B2 | 4/2015 | Friedrich et al. | |
| 9,068,859 B2 | 6/2015 | Dwyer et al. | |
| 9,172,565 B2 | 10/2015 | Cadugan et al. | |
| 9,210,015 B2 | 12/2015 | Scherr et al. | |
| 9,222,990 B2 | 12/2015 | Dwyer et al. | |
| 9,252,945 B2 | 2/2016 | Lewis et al. | |
| 9,300,235 B2 | 3/2016 | Ng et al. | |
| 9,444,613 B2 | 9/2016 | Hammerschmidt et al. | |
| 9,455,849 B2 | 9/2016 | Scherr et al. | |
| 9,552,315 B2 | 1/2017 | Monreal | |
| 9,634,715 B2 | 4/2017 | Scheinkerman et al. | |
| 9,664,748 B2 | 5/2017 | Friedrich et al. | |
| 9,667,409 B2 | 5/2017 | Scherr | |
| 9,739,846 B2 | 8/2017 | Petrie et al. | |
| 9,787,495 B2 | 10/2017 | Vreeland et al. | |
| 9,983,045 B2 | 5/2018 | O'Neill | |
| 10,145,908 B2 | 12/2018 | David et al. | |
| 10,184,807 B2 | 1/2019 | Motz et al. | |
| 10,216,559 B2 | 2/2019 | Fernandez | |
| 10,290,608 B2 | 5/2019 | Latham et al. | |
| 10,326,621 B1 | 6/2019 | Geisler et al. | |
| 10,330,499 B2 | 6/2019 | Elliott et al. | |
| 10,436,606 B2 | 10/2019 | Kerdraon et al. | |
| 10,473,486 B2 | 11/2019 | Doogue et al. | |
| 10,480,957 B2 | 11/2019 | Kerdraon et al. | |
| 10,481,218 B2 | 11/2019 | Prentice et al. | |
| 10,495,485 B2 | 12/2019 | Burdette et al. | |
| 10,495,700 B2 | 12/2019 | Prentice et al. | |
| 10,540,221 B2 | 2/2020 | Shevelenok et al. | |
| 10,571,301 B2 | 2/2020 | Doogue et al. | |
| 10,598,514 B2 | 3/2020 | Pepka et al. | |
| 10,635,539 B2 | 4/2020 | Cook et al. | |
| 10,651,147 B2 | 5/2020 | Latham et al. | |
| 10,656,170 B2 | 5/2020 | Lim et al. | |
| 10,670,672 B2 | 6/2020 | David et al. | |
| 10,700,848 B2 | 6/2020 | Scherr | |
| 10,747,708 B2 | 8/2020 | Kozomora et al. | |
| 11,032,100 B2 | 6/2021 | Scherr | |
| 11,079,291 B2 | 8/2021 | Bertin | |
| 11,112,230 B2 | 9/2021 | Latham et al. | |
| 11,112,275 B2 | 9/2021 | Bertin | |
| 11,119,969 B2 | 9/2021 | Okajima | |
| 11,129,666 B2 | 9/2021 | Messerly et al. | |
| 11,194,004 B2 | 12/2021 | Scheller et al. | |
| 11,215,982 B2 | 1/2022 | Urano et al. | |
| 11,221,203 B1 | 1/2022 | Ferrer et al. | |
| 11,326,903 B1 | 5/2022 | Casu et al. | |
| 11,333,486 B2 | 5/2022 | Rigoni et al. | |
| 11,368,533 B2 | 6/2022 | Kozomora et al. | |
| 11,408,755 B2 | 8/2022 | Bertin | |
| 11,435,206 B2 | 9/2022 | Drouin | |
| 11,460,286 B2 | 10/2022 | Gillet et al. | |
| 11,726,180 B2 | 8/2023 | Hu et al. | |
| 2008/0159467 A1* | 7/2008 | Kassner | G01P 3/481 377/20 |
| 2010/0060268 A1* | 3/2010 | Tokunaga | G01B 7/30 324/207.2 |
| 2014/0035564 A1 | 2/2014 | Lee et al. | |
| 2015/0295525 A1 | 10/2015 | Liu et al. | |
| 2016/0123769 A1* | 5/2016 | Nishimoto | G01D 5/145 324/207.23 |
| 2017/0163366 A1 | 6/2017 | Aichriedler | |
| 2018/0283903 A1* | 10/2018 | Mochizuki | G01B 7/30 |
| 2019/0039643 A1* | 2/2019 | Oka | B62D 6/10 |
| 2019/0199451 A1 | 6/2019 | Krall et al. | |
| 2019/0306592 A1 | 10/2019 | Pusheck et al. | |
| 2019/0360839 A1 | 11/2019 | Shao | |
| 2020/0180689 A1 | 6/2020 | Asaka | |
| 2020/0244481 A1 | 7/2020 | Scherr | |
| 2020/0378802 A1 | 12/2020 | Yashan et al. | |
| 2020/0386575 A1 | 12/2020 | Weiland et al. | |
| 2021/0057330 A1 | 2/2021 | Briano et al. | |
| 2021/0190545 A1 | 6/2021 | Utermoehlen et al. | |
| 2021/0247213 A1 | 8/2021 | Metivier et al. | |
| 2022/0026243 A1 | 1/2022 | Howley et al. | |
| 2022/0070035 A1 | 3/2022 | Ferrer et al. | |
| 2022/0099463 A1* | 3/2022 | Schmidt | G01D 5/165 |
| 2022/0239462 A1 | 7/2022 | Casu et al. | |

FOREIGN PATENT DOCUMENTS

| | | |
|---|---|---|
| DE | 199 11 774 A1 | 12/1999 |
| DE | 102019009169 W | 12/2020 |
| EP | 0158645 24 | 2/1988 |
| EP | 0 944 888 A2 | 9/1999 |
| EP | 1490772 | 12/2004 |
| EP | 3 015 994 A1 | 5/2016 |
| JP | 2001-505691 A1 | 4/2001 |
| JP | 4142109 B2 | 8/2008 |
| JP | 2012-145371 A | 8/2012 |
| KR | 2017-0124521 A | 11/2017 |
| WO | WO 98/25148 A2 | 6/1998 |
| WO | WO 01/20351 A1 | 3/2001 |
| WO | WO 2015/126539 A1 | 8/2015 |

OTHER PUBLICATIONS

Asilomar, "Fifty-First Asilomar Conference on Signals, Systems, and Computers;" Final Program and Abstracts; Oct. 29-Nov. 1, 2017; Part 1 of 2; 70 Pages.

Asilomar, "Fifty-First Asilomar Conference on Signals, Systems, and Computers;" Final Program and Abstracts; Oct. 29-Nov. 1, 2017; Part 2 of 2; 63 Pages.

PCT International Search Report and Written Opinion dated Aug. 11, 2023 for International Application No. PCT/US2023/064519; 19 Pages.

Examination Report dated Nov. 29, 2023 for European Application No. 21187747.7; 5 Pages.

Response to European Examination Report dated Nov. 29, 2023 filed on Jan. 9, 2024 for European Application No. 21187747.7; 13 Pages.

Search Reporting and Written Opinion dated Sep. 4, 2023 for PCT Application No. PCT/US2023/062254; 29 pages.

Renesas Datasheet IPS2200 "Inductive Position Sensor IC"; Jul. 15, 2020; 21 pages.

White, "A Tutorial for the Digital SENT Interface;" Integrated Device Technology, Inc.; Retrieved from the Internet: https://aws1.disclosure-cdn.com/arduino/original/3X/d/5/d52079ebf8e81b5a95aae835ebaf1257b280f804.pdf on Jan. 18, 2022; Jan. 1, 2014; 4 Pages.

Office Action dated Oct. 26, 2021 for U.S. Appl. No. 17/097,498, 12 pages.

Response to Office Action dated Oct. 26, 2021 filed on Jan. 20, 2022 for U.S. Appl. No. 17/097,498; 9 pages.

Notice of Allowance dated Feb. 28, 2022 for U.S. Appl. No. 17/097,498; 8 pages.

Extended European Search Report (EESR) dated Feb. 3, 2022 for European Application No. 21187747.7; 11 Pages.

Office Action dated Mar. 11, 2022 for U.S. Appl. No. 16/952,215; 8 pages.

Response to Office Action dated Mar. 11, 2022 filed on Apr. 7, 2022 for U.S. Appl. No. 16/952,215; 18 pages.

Notice of Allowance dated May 4, 2022 for U.S. Appl. No. 16/952,215; 9 pages.

Response to European Communication Pursuant to Rule 69 dated May 31, 2022 and Extended European Search Report dated Feb. 3, 2022 for European Application No. 21187747.7; Response Filed Nov. 4, 2022; 20 Pages.

Response to Office Action dated May 28, 2024, filed on Jun. 4, 2024 for U.S. Appl. No. 17/658,872, 11 pages.

Intention to Grant dated May 17, 2024 for European Application No. 21187747.7, 7 pages.

Office Action dated May 28, 2024 for U.S. Appl. No. 17/658,872, 13 pages.

(56) References Cited

OTHER PUBLICATIONS

Notice of Allowance dated Jul. 19, 2024 for U.S. Appl. No. 17/658,872, 8 pages.
U.S. Appl. No. 18/426,449, Jan. 30, 2024, Veilleux.
U.S. Appl. No. 18/498,109, filed Oct. 31, 2023, Halawani et al.

* cited by examiner

SENSOR WITH ESTIMATED REAL-TIME PARAMETER DATA

BACKGROUND

As is known in the art, sensors can detect the position of a moving target. For example, sensors can detect magnetic field changes caused by rotating targets to determine the position of the target. However, the target position information is out of date by the time the information is used. In conventional systems, a receiver that processes the target information can receive target position information that is out of date when received.

SUMMARY

Example embodiments of the disclosure provide methods and apparatus for transmitting an estimated parameter for a future time that can be treated by the receiving device as real-time target location data. The parameter can comprise various types of parameters that can be generated from various sensor types. In embodiments, the parameter is expected to change over time. Current parameter data can be used estimate the parameter for the future time. The future time can be specified based on multiple components, such as processing time for sensor data, transmission time, and processing time for the receiving device. In embodiments, the receiving device can treat the estimated parameter as real-time information.

In embodiments, a device, such as an integrated circuit (IC), measures a parameter, such as current rotational angle and predictively calculates an angle at a specific moment in the future. The estimated target angles can be digitally output and may include compensating for the time required to transmit and process the data, which may include internal and/or external processing time with respect to the IC and/or receiver. Example embodiments of the disclosure provide a synchronized angle measurement and data transmission system that compensates for rotational changes in target position that occur during data transmission and processing so that the receiver of the data can decode an angle value that represents the predicted actual target angle position at that exact moment in time.

In order to efficiently commutate and spin a brushless, synchronous motor, for example, the position of the rotor should be accurately known by a controller. However, a rotating motor continuously changes in angle, it takes time for a sensor to measure the angle and transmit data, and it takes time for the receiver to process the data. By the time a receiver possesses angle information, the information is outdated, which can result in a less efficient motor drive system that may exhibit undesirable torque ripple. While using analog voltages to transmit the sensed angle can reduce delay, they do not eliminate delay. In addition, analog voltages may not provide certain benefits of digital data transmission, such as noise immunity, diagnostics reporting capability, wire count reduction, greater accuracy, and a direct angle value that does not require computation.

Example embodiments enable the receiver, at the time the target position is used, to interpret the target position information as real-time information. This allows motor drive circuits, for example, to commutate for maximal motor performance.

While example embodiments of the disclosure are directed to motor control applications, and particularly, angle and/or linear position measurement applications, it is understood that embodiments are applicable to sensor data and estimated parameter data applications in general in which it is desirable to have parameter data that does not need to be processed by a receiving device. Another example embodiment is an IC that measures electric current and transmits the measured data using a digital protocol, employing estimated real-time parameter data. The advantages of using parameter information without processing it, e.g., as real-time data, will be readily apparent to those skilled in the art of software development for system control, for example.

In one aspect, a method comprises: receiving data at a first time from at least one sensor; determining a parameter from the received data for the first time; estimating the parameter for a future time based on the data for first time; and outputting the estimated parameter for the future time to a receiving device.

A method can further include one or more of the following features: the data comprises one or more of temperature data, optical data, electrical current, magnetic flux density, position, angle and/or electromagnetic field strength, the at least one sensor comprises an inductive sensor, a magnetic field strength sensor, an optical sensor, a temperature sensor, a current sensor, an angle sensor, and/or magnetic position sensor, the at least one sensor comprises a part of an integrated circuit (IC) package, the at least one sensor is connected to an integrated circuit (IC) package, estimating the parameter for the future time is performed by an integrated circuit (IC) package, outputting the estimated parameter to the receiving device is performed by the IC package, the IC package comprises a magnetic field sensor integrated circuit (IC) package and the parameter comprises an angle position of a target at the first time, wherein the IC package is configured to determine a speed of rotation of the target, the IC package is configured to estimate the angle position of the target at a future time based on the speed of rotation and the angle position of the target at the first time, the IC package is configured to output the estimated angle position of the target at the future time in a communication protocol, estimating the future time includes estimating a time to process the data from the at least one sensor, estimating the future time includes estimating a time to perform processing for generating the estimated parameter at the future time, estimating the future time includes estimating a time corresponding to digital transmission of the estimated parameter at the future time to the receiving device, estimating the future time includes estimating a time for the receiving device to process the estimated parameter at the future time, estimating the future time includes: estimating a time for an IC package to process signals from the at least one sensor in the IC package; estimating a time for the IC package to perform processing for the estimating of the parameter at the future time; estimating a time corresponding to transmission of the estimated parameter at the future time to the receiving device; and estimating a time for the receiving device to process the estimated parameter at the future time, the receiving device comprises an engine control unit (ECU), outputting the estimated parameter in a communication protocol, the communication protocol comprises Serial Peripheral Interface (SPI), Single-Edge Nibble Transmission (SENT), Controller Area Network (CAN bus), Low-voltage differential signaling (LVDS), I$^2$C, Pulse Width Modulation (PWM), and/or ABI, the communication protocol comprises pulses to achieve a constant length for a message, and/or the estimated parameter is transmitted in nibbles.

In another aspect, a system comprises an interface to receive data at a first time from at least one sensor; a processing module to determine a parameter from the received data for the first time, and to estimate the parameter for a future time based on the data for first time; and an output to output the estimated parameter for the future time to a receiving device.

A device can further include one or more of the following features: the data comprises one or more of temperature data, optical data, electrical current, magnetic flux density, position, angle and/or electromagnetic field strength, the at least one sensor comprises an inductive sensor, a magnetic field strength sensor, an optical sensor, a temperature sensor, a current sensor, an angle sensor, and/or magnetic position sensor, the at least one sensor comprises a part of an integrated circuit (IC) package, the at least one sensor is connected to an integrated circuit (IC) package, estimating the parameter for the future time is performed by an integrated circuit (IC) package, outputting the estimated parameter to the receiving device is performed by the IC package, the IC package comprises a magnetic field sensor integrated circuit (IC) package and the parameter comprises an angle position of a target at the first time, wherein the IC package is configured to determine a speed of rotation of the target, the IC package is configured to estimate the angle position of the target at a future time based on the speed of rotation and the angle position of the target at the first time, the IC package is configured to output the estimated angle position of the target at the future time in a communication protocol, estimating the future time includes estimating a time to process the data from the at least one sensor, estimating the future time includes estimating a time to perform processing for generating the estimated parameter at the future time, estimating the future time includes estimating a time corresponding to digital transmission of the estimated parameter at the future time to the receiving device, estimating the future time includes estimating a time for the receiving device to process the estimated parameter at the future time, estimating the future time includes: estimating a time for an IC package to process signals from the at least one sensor in the IC package; estimating a time for the IC package to perform processing for the estimating of the parameter at the future time; estimating a time corresponding to transmission of the estimated parameter at the future time to the receiving device; and estimating a time for the receiving device to process the estimated parameter at the future time, the receiving device comprises an engine control unit (ECU), outputting the estimated parameter in a communication protocol, the communication protocol comprises Serial Peripheral Interface (SPI), Single-Edge Nibble Transmission (SENT), Controller Area Network (CAN bus), Low-voltage differential signaling (LVDS), I²C, Pulse Width Modulation (PWM), and/or ABI, the communication protocol comprises pulses to achieve a constant length for a message, and/or the estimated parameter is transmitted in nibbles.

BRIEF DESCRIPTION OF THE DRAWINGS

The foregoing features of this invention, as well as the invention itself, may be more fully understood from the following description of the drawings in which.

DETAILED DESCRIPTION

Figure 1:
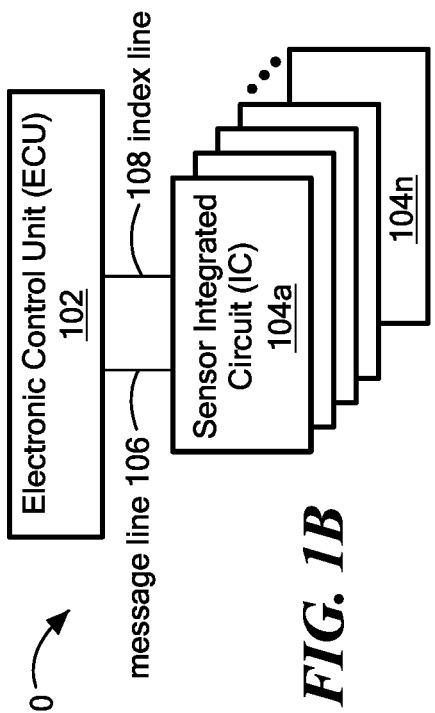
FIG. 1 shows an example sensor configuration for providing an estimated parameter data for a future time.

FIG. 1 shows an example sensor configuration for generating estimated parameter data for a future given time in accordance with example embodiments of the disclosure. A sensor integrated circuit (IC) package 2 is coupled to one or more sensing elements 4. In some embodiments, the sensing elements 4 are integrated within the IC package. The sensor IC package 2 is coupled to a receiving device 6 that can receive data that corresponds to the future given time. At the future time, the receiving device 6 can treat the data as real-time data for the given time which is now the given/ present time instead of a future time. With this arrangement, the receiving device 6 does not need to process the data other than to use the data as real-time information.

It is understood that the sensing elements used to generate the parameter data can include any practical type of sensing element and that the parameter can comprise a wide variety of parameters that can be generated from the corresponding sensing element(s). Example sensing elements and/or configurations include inductive sensors for sensing electromagnetic fields generated by the Eddy currents induced in the target. An IC configuration can include coils to generate a primary field and process signals from receive coils. In other embodiments, an IC can include transducers to transform energy from one form to another form, such as magnetic field sensors, optical sensors, temperature sensors, current sensors, angle sensors, and the like.

Figure 1B:
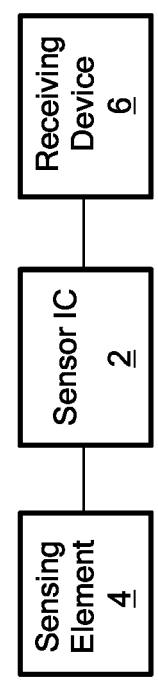
FIG. 1B is a block diagram showing the sensor of FIG. 1A coupled to a receiving device.
Figure 1A:
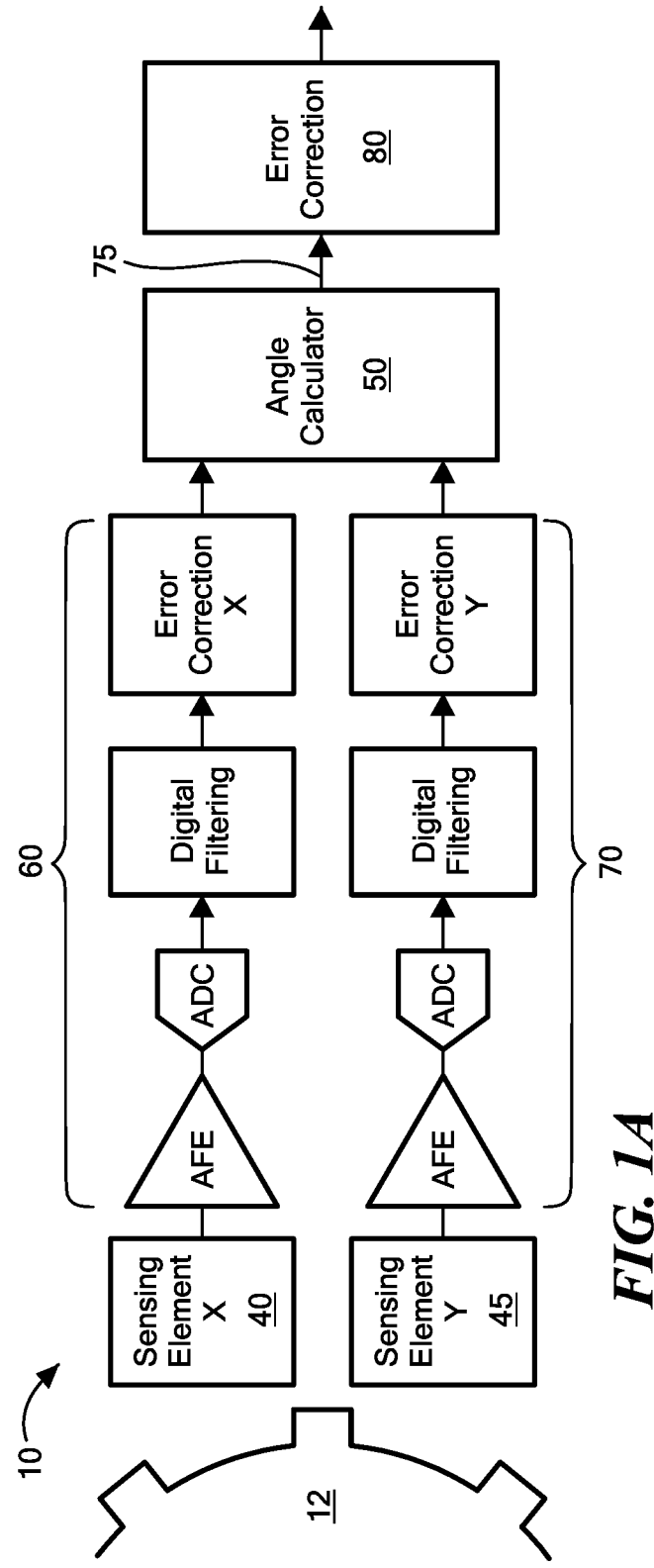
FIG. 1A shows an example magnetic field sensor for providing an estimated angular position of a target at a future time.

FIG. 1A shows an example angle sensor 10 generating estimated target position data for a future time in accordance with example embodiments of the disclosure. The angle sensor 10 can be any sensor configured to provide angular position information, and in some instances speed and direction information, including magnetic sensor ICs and inductive sensor ICs. Additionally, the angle sensor 10 can be a contactless sensor that can provide angular position and speed or direction information of the target 12. The angle sensor 10 can provide this target information over a span of zero to three-hundred-sixty degrees (0°-360°), or a reduced angular span. Example targets 12 can include a rotating target 12 such as a gear or magnet attached to a shaft. Illustrated in FIG. 1A is one example of a target 12; the target 12 can be any size or three-dimensional geometry.

The angle sensor 10 can generate high resolution output by executing error correction and calibration applications that error correct and calibrate the angle sensor 10 output to account for manufacturing inconsistencies and non-orthogonality between the sensing channels 60, 70 of the sensing elements 40, 45.

The angle sensor 10 can be used to sense the angular position, speed and/or the direction of a target 12 using one or more magnetic field sensing elements to detect a magnetic field and output magnetic field signals representative of the sensed magnetic field. These magnetic field sensing elements can be a magneto-transistor or magnetoresistance element, or a semiconductor magnetoresistance element such as an anisotropic magnetoresistance (AMR) sensing element, a giant magnetoresistance (GMR) sensing element, tunnel-magnetoresistance (TMR) sensing element, a magnetic tunnel junction (MTJ) sensing element, Indium Antimonide (InSb) or a Hall Effect element. In some embodiments, the magnetic field sensing element can be arranged to form a circular vertical hall (CVH) sensing element which can include a circular body with a plurality of Hall Effect elements disposed thereon and around the circumference of the circular body.

The angle sensor 10 can also employ other technologies than magnetic fields to determine the angle of the target 12. For example, some embodiments can include electromagnetic inductive sensing using coils that generate eddy currents onto the target. This type of sensor is often referred to as an inductive position sensor. U.S. Pat. No. 11,460,286, which is incorporated by reference herein, shows an example inductive sensor.

In example embodiments, the angle sensor 10 can have an X sensing channel 60 that receives and processes raw sensor output from magnetic field sensing element X 40, and a Y sensing channel 70 that receives and processes raw sensor output from magnetic field sensing element Y 45. This raw sensor output can be magnetic field signals generated by the magnetic field sensing elements. The magnetic field sensing elements 40, 45 can be arranged orthogonally with respect to each other such that one of the magnetic field sensing elements 40, 45 generates a cosine signal and the other element 40, 45 generates a sine signal.

Other embodiments can include any practical number of sensing elements, such as three sensing elements at 0, 60, and 120 degrees from which it is possible to calculate target angle.

Each sensing channel 60, 70 can include a series of circuits or components that process the magnetic field signals from the magnetic field sensing elements 40, 45. Included in each sensing channel 60, 70 is an analog front end (AFE) which can include a filter, an amplifier or any other circuit element configured to attenuate or amplify amplitudes or filter frequencies. The AFE receives the magnetic field signals and outputs modified magnetic field signals to an analog-to-digital converter (ADC) to digitize the magnetic field signals. Digital filtering circuitry and error correction circuitry included within the sensing channels 60, 70 receive the digitized magnetic field signals and error correct the digitized signals. In some instances, the digital filtering circuit performs offset correction, sensitivity mismatch compensation and non-orthogonality compensation. It should be appreciated that while FIG. 1A illustrates two magnetic field sensing elements, i.e., magnetic field sensing element X 40 and magnetic field sensing element Y 45, the angle sensor 10 can include more than two magnetic field sensing elements. Additionally, the magnetic field sensing elements can be any magnetic field sensing elements described herein.

An angle calculator 50 receives the digitized magnetic field signals from the X sensing channel 60 and the Y sensing channel 70 and uses the digitized magnetic field signals to generate an uncorrected angle signal 75. This uncorrected angle signal 75 may provide an imprecise representation of the magnetic field angle that contains errors. In some instances, the angle calculator 50 can be a circuit comprising one or more logic gates, and/or a processor configured to compute trigonometric, exponential and logarithmic functions. In other embodiments, the angle calculator 50 is a coordinate rotation digital computer (CORDIC) processor configured to compute an arctangent function. The uncorrected angle signal 75 generated by the angle calculator 50 represents aspects of the sensed magnetic field such as the angular position and/or speed of a target 12. As described more fully below, the angle calculator module 50 can estimate target position at a given time in the future. In embodiments, the uncorrected angle signal 75 is processed by a digital signal processor 80 in order to reduce or remove errors.

In other embodiments, the angle calculator 50 comprises phase-locked loop (PLL)-based angle tracking observer (ATO) of proportional-integral-integral type (PI type II) or of other type, configured to compute an angle and the rotational speed and possibly acceleration (in case of type-III controller).

An estimated angular target position in digital form can be expressed as: Digital Output Angle=Current Angle+Angular Speed*Compensated Time Delay, as described more fully below.

It is understood that embodiments are applicable to angle sensors in general in which it is desirable to use an estimated "real-time" target position to reduce or eliminate the need to process target position information prior to utilization of the information. It is understood that estimated real-time target position can be provided for an any practical angle sensor configuration. Example angle sensors are shown in described in U.S. Pat. Nos. 9,007,054, and 11,112,230, and 11,333,486, all of which are incorporated herein by reference.

FIG. 1B shows an example angle sensor implementation in that includes a system 100 having an electronic control unit (ECU) 102 (sometimes referred to as a "master component") and one or more sensor integrated circuits (ICs) 104a-104n (sometimes referred to as "slave components"), such as an angle sensor. The ICs 104a-104n can be sensors of various types, such as, for example, a current sensor, a speed sensor, an angle sensor, a magnetic field sensor, a temperature sensor, a pressure sensor, a chemical sensor, a motion sensor, a rotational direction sensor, a position sensor, an optical sensor, and so forth. ICs 104a-104n may be the same type of sensor (e.g., each a magnetic field sensor) or may be different types of sensors (e.g., one is a temperature sensor and the others are magnetic field sensors). ICs 104a-104n may monitor the same or different target parameters.

The format of the data transmitted to the ECU 102 can comprises various unidirectional and/or bidirectional formats, including but not limited to Serial Peripheral Interface (SPI), Single-Edge Nibble Transmission (SENT), Controller Area Network (CAN bus), Low-voltage differential signaling (LVDS), I²C, Pulse Width Modulation (PWM), ABI, to name a few. For example, a unidirectional SENT format may be used by the IC 104a to transmit absolute data to the ECU 102 on the message line 106. In other examples, a bidirectional format (e.g., a triggered SENT or Manchester format) may be used by the IC 104a to transmit data to the ECU 102 on the message line 106 after receiving a request from the ECU 102.

Figure 2:
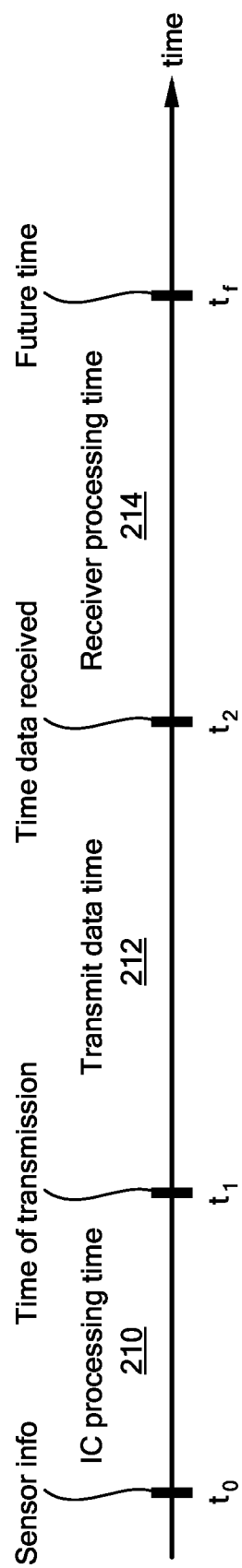
FIG. 2 shows an example timing diagram to generate estimated angular position of a target at a future time.

FIG. 2 shows an example timing diagram for the magnetic field angle sensor IC package 10 of FIG. 1A showing estimating angular position of a target at a future time tf in relation to an initial time t0. At some initial time t0, sensor data from magnetic field sensing elements is obtained. The sensor data is indicative of the position of a rotating target positioned in relation to the sensor IC package at the initial time t0. In example, embodiments, the sensor IC 10 processes the sensor data and generates an estimated angular target position at the future time tf.

In order to estimate angular position at the future time tf, the sensor IC takes into account a number of time components that make up the difference between t0 and tf. As shown in FIG. 2, the sensor IC 10 (FIG. 1A) requires time to process the sensor data for the initial time t0 and estimate the target position at the future time tf. To estimate the target position at the future time tf, the sensor IC should determine the rotational characteristics of the target, such as rotational speed and optionally acceleration. With this information, it can be determined what the target position will be at the future time tf by computing how much the target will rotate between a time defined as tf-t0.

In example embodiments, time defined as tf-t0 can include IC processing time 210, which is the time required to process the sensor data and target rotational characteristics to output the estimated target position at the future time. The time defined as tf-t0 can include a time to transmit 212 the estimated future target position to a receiving device, as described more fully below. The time defined as tf-t0 can further include a time 214 for the receiving device to process the estimated future target position. In example embodiments, the receiving device can treat the estimated future target position as real-time data. That is, in embodiments, the receiving device does not need to process the data to estimate the real-time target position, but rather, can use the IC-predicted target position as the actual target position at the now present time.

It is understood that additional time components can be used to further refine the estimated future target position. For example, fine adjustments can be made based on temperature data, which may affect circuit processing speed or propagation delay. Some embodiments can include predictive schemes that consider motor inertia, or the maximum acceleration possible from a motor design, and implement programmable acceleration variables into the IC to increase the predicted angle accuracy at the future time.

In other embodiments, dynamic time adjustments can be made. For example, transmission time 212 can be adjusted based on changes in the protocol used to transmit data. In some embodiments, time adjustments can be made based on a change in the particular packet and/or location within a packet used to transmit the estimated future target position. That is, any change in data transmission characteristics can be reflected by a change in future time tf.

In some embodiments, the SENT communication protocol can be used to transmit data from the sensor to a receiver, such as an ECU. As is known in the art, the SENT communication protocol is a uni-directional asynchronous three-wire interface that includes a signal line, a supply voltage line, and a ground line. In some implementations, the supply voltage is 5V and the signal line has a low state that is less than 0.5V and a high state that is greater than 4.1V. Pulse width modulation (PWM) is used to encode a nibble (4 bits) for each symbol. In the SENT protocol, time units are referred to as ticks, and tick time can be configurable in units of microseconds. A calibration pulse precedes each message and includes a high period of fifty-six ticks to frame and calibrate tick length. Each nibble has a fixed-width low signal followed by a variable-length high period. The low-period is at least five ticks in length and the high period can vary for a total time of 12 to 27 ticks between falling edges representing nibbles ranging from 0 to 15.

A message in the SENT protocol is 32 bits long, i.e., eight nibbles, and includes 24 bits of signal data that represents two measurement channels of three nibbles each, four bits for error detection, and four bits (one nibble) of status/communication information. The transmitted data units have four bits (one nibble) where an interval between falling edges of the modulated constant-amplitude signal is evaluated.

In some implementations, twenty bit (five nibbles) messages are transmitted with a single three nibble measurement, a one nibble error checksum, and a one nibble status/communication field. An optional pause pulse may be located at the end of each message to achieve a constant number of ticks. Pause pulses can compensate for the varying length of the messages.

Figure 3:
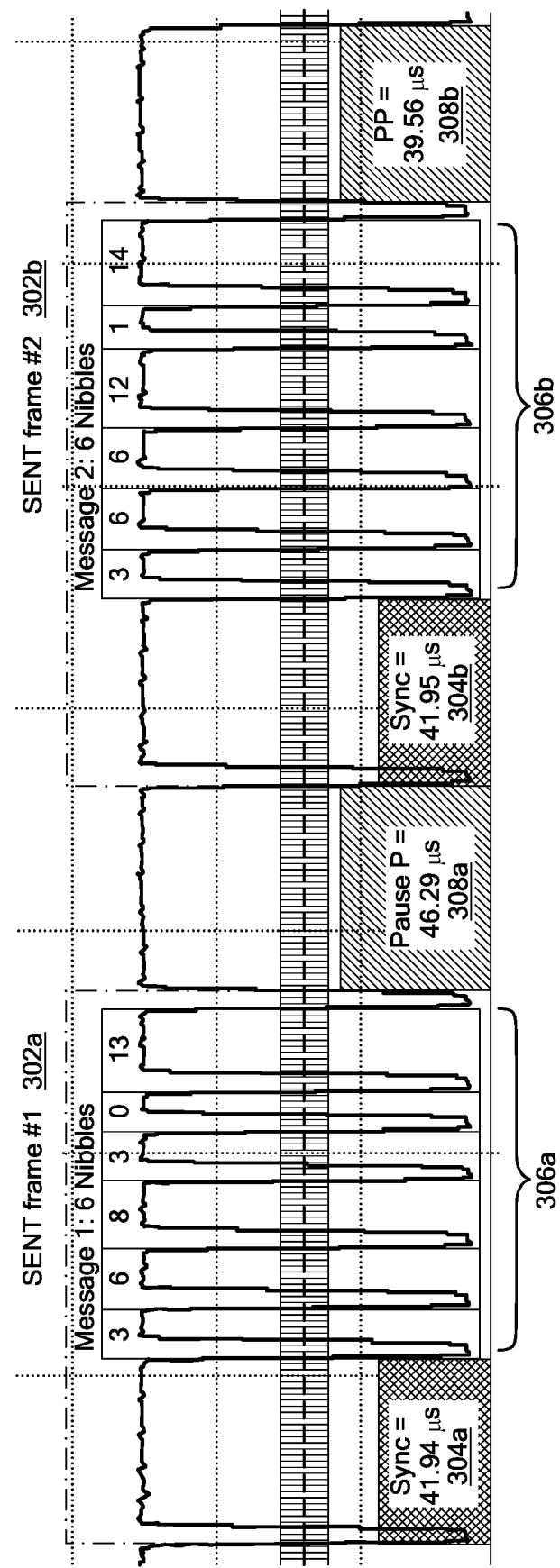
FIG. 3 is a diagram showing a SENT communication protocol to transmit estimated angular position of a target at a future time.

FIG. 3 shows a first SENT frame 302a and a second SENT frame 302b each having a beginning sync portion 304a, 304b, a message portion 306a, 306b, and optional pause pulses 308a,b to compensate for differing message lengths. In the illustrated embodiment, prior to transmission of the first frame 302a, target position data for a first position θ1 (FIG. 4) is determined from sensor element data. The sensor computes an estimated angular position θ2 for the target at some future time based on movement characteristics of target rotation, such as speed, acceleration, and the like. The estimated angular position θ2 for the target at some future time can be transmitted in the first frame 302a. In some embodiments, each frame can include future target position data.

In example SENT protocol implementations, the required synchronized time compensation can be based on data processing time internal to the angle sensor IC, the SENT tick time, the SENT frame contents and length, and the data processing time at the receiver, for example.

Figure 4:
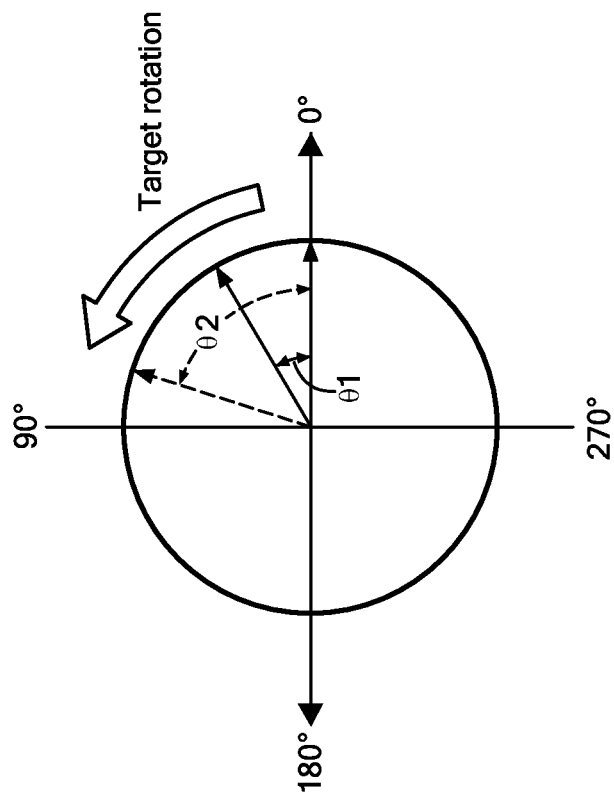
FIG. 4 is a schematic representation of target position change over time.

As shown in FIG. 4, the target may have an initial position defined as first angular position θ1 and a second position θ2 at a future time. It is understood that illustrated target positions may not be to scale but rather merely intended to show target movement over time. The difference in angular position θ2-θ1 corresponds to rotational movement of the target over time. The speed of rotation of the target determines the change in position for a given amount of time.

For example, a SENT tick time of 0.5 µs may be used, along with a configuration that involves 191 ticks per frame. In this case, each frame takes 95.5 µs to transmit. A target rotating at 1 kHz moves 0.36°/µs, and rotates (0.36°/µs)× (95.5 µs)=34° in the time it takes to transmit each SENT frame. The same target rotating at 4 kHz rotates 138° in the time it takes to transmit each SENT frame. In this way, the target's speed is directly proportional to the future angle estimation, based on the future time compensation specified.

In embodiments, additional time can be allotted for the receiving circuit (such as an ECU) to process the angle data after the SENT transmission and prepare it for application. The estimated future target position can be transmitted in the message portion 306a of the first SENT frame, as shown in FIG. 3. Similarly, the second frame 302b can contain estimated future target position for time based on sensor data collected at the end of the first SENT frame, and so on.

In some embodiments, the target position at a given future time can be computed from a known time of transmission so that the processing time to compute the current target position does not need to be known. That is, for sensor data for an initial time, it may be known at what time future target position will be transmitted. As long as there is sufficient processing time prior to transmission, a known transmission time can be used. As noted above, receiver processing time may be taken into account.

While example embodiments of the disclosure are shown in and described in conjunction with the SENT protocol, it is understood that any suitable communication protocol can be used that allows a time of transmission to be known and/or determined to enable estimated real-time target position.

Figure 5:
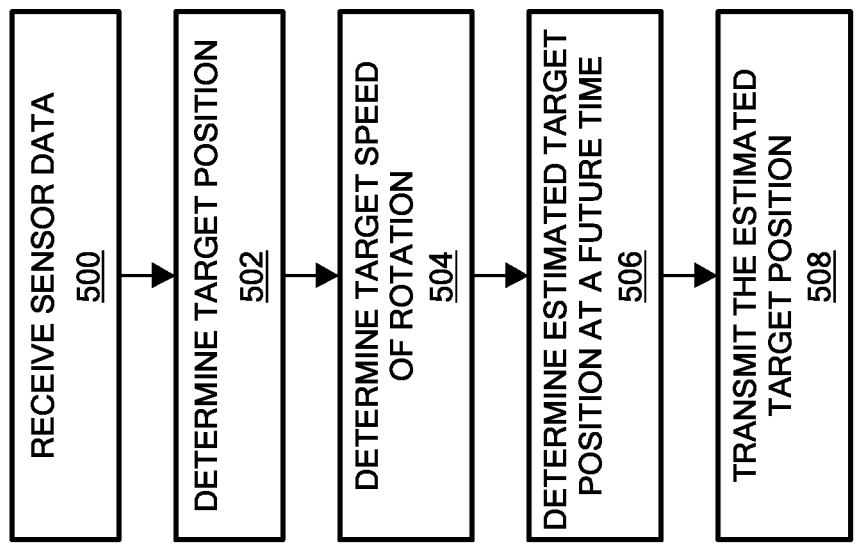
FIG. 5 is a flow diagram showing an example sequence of steps for generating estimated angular position of a target at a future time.

FIG. 5 shows an example sequence of steps for generating and outputting an estimated target position at a future time that can be treated as real-time information by a receiving device. In step 500, data from sensing elements, which may comprise Hall Effect elements, magnetoresistance (MR) elements, or inductive coil elements, is received. In step 502, the received sensor data is processed to determine the current target position. In step 504, the target speed of rotation is determined. In step 506, an estimated target position at a future time is determined based on the speed of target rotation, for example. In step 508, the estimated target position data is transmitted to a receiving device, such as an ECU, which can treat the position data as real-time data for target position.

Example embodiments of the disclosure provide a sensor IC that determines current angular target position, determines the speed of target rotation, estimates angular target position at a particular time in the future, and outputs the estimated angular target position to a receiving device. The receiving device can treat the estimated target position as real-time data for the present time.

Embodiments of the disclosure provide advantages compared to conventional systems that compensate for outdated angle data at the receiver controller since example sensor IC embodiments can calculate speed of rotation significantly faster than the period of the digital output. Thus, changes in rotational speed (acceleration) can be determined almost a full digital protocol period earlier, resulting in greater accuracy of the predicted angle. In some embodiments, an IC can share an oscillator frequency reference with the digital output protocol bit time and the future angle estimation circuits. With such an arrangement, semiconductor variation in oscillator frequency can equally affect the output protocol transmission time and the time compensation, creating inherent synchronization that minimizes system error. A final advantage outlined in this embodiment is the simplification of software in the ECU by integrating future angle estimation within the IC. This aspect can decrease development time, simplify the software qualification process, and minimize new development risk.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 6:
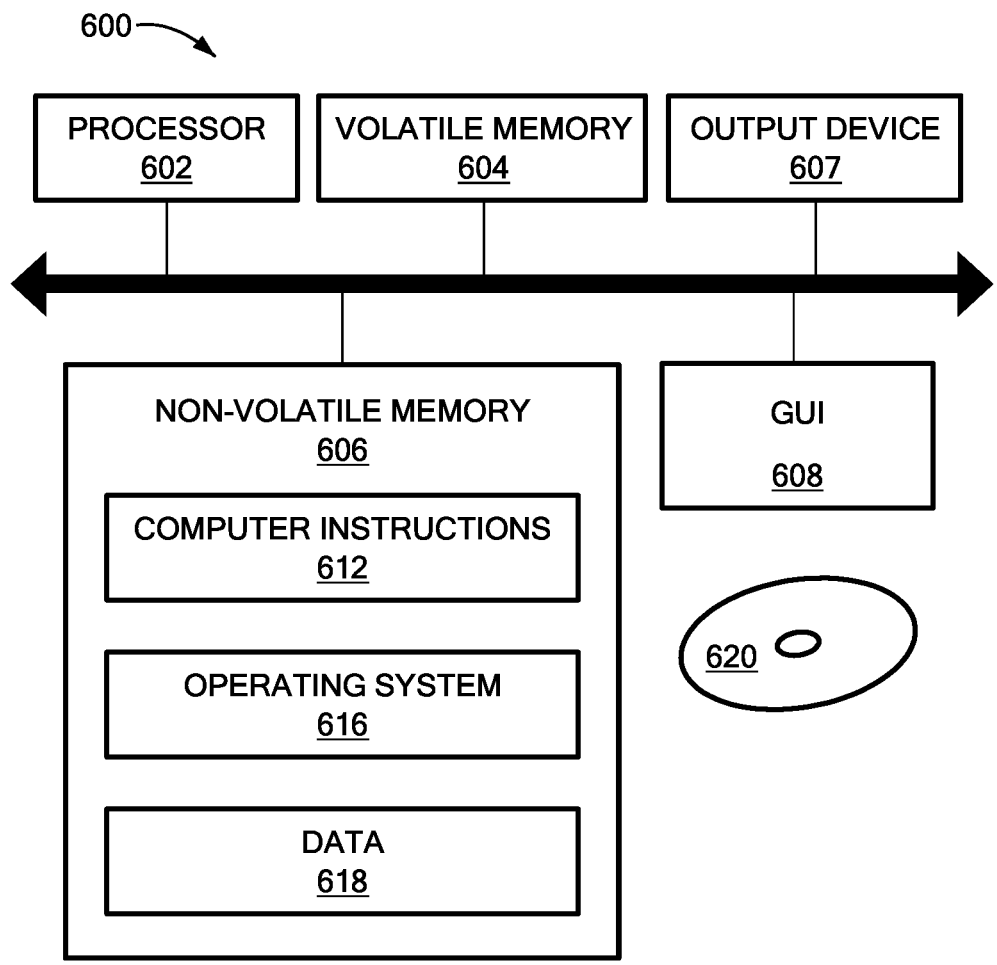
FIG. 6 is a block diagram of an example computer that can perform at least a portion of the processing described herein.

FIG. 6 shows an exemplary computer 600 that can perform at least part of the processing described herein. In some embodiment, the computer comprises a microcontroller or a controller that receives the angle signals from IC and use them after needed processing to drive a motor, e.g., the ECU of car.

In the illustrated embodiment, the computer 600 includes a processor 602, a volatile memory 604, a non-volatile memory 606 (e.g., hard disk), an output device 607 and a graphical user interface (GUI) 608 (e.g., a mouse, a keyboard, a display, for example). The non-volatile memory 606 stores computer instructions 612, an operating system 616 and data 618. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, one or more microcontroller, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
receiving data at a first time from at least one sensor;
determining a parameter from the received data for the first time;
estimating the parameter for a future time based on the data for first time; and
outputting the estimated parameter for the future time to a receiving device, wherein estimating the parameter for the future time includes:
estimating a time for an IC package to process signals from the at least one sensor in the IC package;
estimating a time for the IC package to perform processing for the estimating of the parameter at the future time;
estimating a time corresponding to transmission of the estimated parameter at the future time to the receiving device; and
estimating a time for the receiving device to process the estimated parameter at the future time.

2. The method according to claim 1, wherein the data comprises one or more of temperature data, optical data, electrical current, position, angle and/or electromagnetic field strength.

3. The method according to claim 1, wherein the at least one sensor comprises an inductive sensor, a magnetic field strength sensor, an optical sensor, a temperature sensor, a current sensor, an angle sensor, and/or magnetic position sensor.

4. The method according to claim 1, wherein the at least one sensor comprises a part of an integrated circuit (IC) package.

5. The method according to claim 1, wherein the at least one sensor is connected to an integrated circuit (IC) package.

6. The method according to claim 1, wherein estimating the parameter for the future time is performed by an integrated circuit (IC) package.

7. The method according to claim 6, wherein outputting the estimated parameter to the receiving device is performed by the IC package.

8. The method according to claim 7, wherein the IC package comprises a magnetic field sensor integrated circuit (IC) package and the parameter comprises an angle position of a target at the first time, wherein the IC package is configured to determine a speed of rotation of the target.

9. The method according to claim 8, wherein the IC package is configured to estimate the angle position of the target at a future time based on the speed of rotation and the angle position of the target at the first time.

10. The method according to claim 9, wherein the IC package is configured to output the estimated angle position of the target at the future time in a communication protocol.

11. The method according to claim 1, wherein the receiving device comprises an engine control unit (ECU).

12. The method according to claim 1, further including outputting the estimated parameter in a communication protocol.

13. The method according to claim 12, wherein the communication protocol comprises Serial Peripheral Interface (SPI), Single-Edge Nibble Transmission (SENT), Controller Area Network (CAN bus), Low-voltage differential signaling (LVDS), I²C, Pulse Width Modulation (PWM), and/or ABI.

14. The method according to claim 12, wherein the communication protocol comprises pulses to achieve a constant length for a message.

15. The method according to claim 12, wherein the estimated parameter is transmitted in nibbles.

16. A system, comprising:
an interface to receive data at a first time from at least one sensor;
a processing module to determine a parameter from the received data for the first time, and to estimate the parameter for a future time based on the data for first time; and
an output to output the estimated parameter for the future time to a receiving device, wherein estimating the parameter for the future time includes:
an estimated time for an IC package to process signals from the at least one sensor in the IC package;
an estimated time for the IC package to perform processing for the estimating of the parameter at the future time;
an estimated time corresponding to transmission of the estimated parameter at the future time to the receiving device; and
an estimated time for the receiving device to process the estimated parameter at the future time.

17. The system according to claim 16, wherein the data comprises one or more of temperature data, optical data, electrical current, position, angle and/or electromagnetic field strength.

18. The system according to claim 16, wherein the at least one sensor comprises an inductive sensor, a magnetic field strength sensor, an optical sensor, a temperature sensor, a current sensor, an angle sensor, and/or magnetic position sensor.

19. The system according to claim 16, wherein the system comprises an integrated circuit (IC) package and the at least one sensor forms part of the IC package.

20. The system according to claim 16, wherein the system comprises an integrated circuit (IC) package and the at least one sensor is connected to the IC package.

21. The system according to claim 16, wherein the system comprises an integrated circuit (IC) package configured to estimate the parameter for the future time.

22. The system according to claim 21, wherein the (IC) package is configured to output the estimated parameter to the receiving device.

23. The system according to claim 22, wherein the IC package comprises a magnetic field sensor integrated circuit (IC) package and the parameter comprises an angle position of a target at the first time, wherein the IC package is configured to determine a speed of rotation of the target.

24. The system according to claim 23, wherein the IC package is configured to estimate the angle position of the target at a future time based on the speed of rotation and the angle position of the target at the first time.

25. The system according to claim 24, wherein the IC package is configured to output the estimated angle position of the target at the future time in a communication protocol.

26. The system according to claim 16, wherein the receiving device comprises an engine control unit (ECU).

27. The system according to claim 16, wherein the system is configured to output the estimated parameter in a communication protocol.

28. The system according to claim 27, wherein the communication protocol comprises Serial Peripheral Interface (SPI), Single-Edge Nibble Transmission (SENT), Controller Area Network (CAN bus), Low-voltage differential signaling (LVDS), I²C, Pulse Width Modulation (PWM), and/or ABI.

29. The system according to claim 27, wherein the communication protocol comprises pulses to achieve a constant length for a message.

30. The system according to claim 22, wherein the system is configured to transmit the estimated parameter in nibbles.

* * * * *